United States Patent
Chuang et al.

(10) Patent No.: US 12,550,619 B2
(45) Date of Patent: Feb. 10, 2026

(54) TECHNIQUES FOR MRAM MTJ TOP ELECTRODE CONNECTION

(71) Applicant: Taiwan Semiconductor Manufacturing Company, Ltd., Hsin-Chu (TW)

(72) Inventors: Harry-Hak-Lay Chuang, Zhubei (TW); Chen-Pin Hsu, Taoyuan (TW); Hung Cho Wang, Taipei (TW); Wen-Chun You, Dongshan Township (TW); Sheng-Chang Chen, Hsinchu County (TW); Tsun Chung Tu, Tainan (TW); Jiunyu Tsai, Hsinchu (TW); Sheng-Huang Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 266 days.

(21) Appl. No.: 17/725,842

(22) Filed: Apr. 21, 2022

(65) Prior Publication Data

US 2022/0246843 A1 Aug. 4, 2022

Related U.S. Application Data

(63) Continuation of application No. 17/381,635, filed on Jul. 21, 2021, now Pat. No. 12,426,514, which is a (Continued)

(51) Int. Cl.
*H01L 23/528* (2006.01)
*H01F 10/32* (2006.01)
(Continued)

(52) U.S. Cl.
CPC ......... *H10N 50/01* (2023.02); *H01F 10/3259* (2013.01); *H01F 41/32* (2013.01);
(Continued)

(58) Field of Classification Search
CPC ...... H10N 50/01; H10N 50/80; H10N 70/841; H01L 23/5226; H01L 23/528; H01L 23/5283; H10B 61/10
See application file for complete search history.

(56) References Cited

U.S. PATENT DOCUMENTS 6,784,091 B1   8/2004   Nuetzel et al.
8,456,883 B1   6/2013   Liu
(Continued)

FOREIGN PATENT DOCUMENTS

CN   107393902 A   11/2017

OTHER PUBLICATIONS

Endoh et al, The Performance of Magnetic Tunnel Junction Integrated on the Back-End Metal Line of Complimentary Metal-Oxide-Semiconductor Circuits, Apr. 20, 2010, Japanese Journal of Applied Physics 49 (2010), pp. 2-6 of the attached PDF file (Year: 2010).*
(Continued)

*Primary Examiner* — Steven B Gauthier
*Assistant Examiner* — E. Rhett Cheek
(74) *Attorney, Agent, or Firm* — Eschweiler & Potashnik, LLC

(57) ABSTRACT

Some embodiments relate to a semiconductor structure having a magnetic tunnel junction (MTJ) on a substrate and a top electrode on the MTJ. A first segment of a top surface of the top electrode adjacent to a first sidewall of the top electrode is different from a second segment of the top surface of the top electrode adjacent to a second sidewall of the top electrode. A sidewall spacer comprises a first spacer on the first sidewall of the top electrode and a second spacer on the second sidewall of the top electrode. A first surface of the first spacer comprises a first curve and a second surface of the second spacer comprises a second curve. A dielectric layer is around the MTJ and top electrode.

20 Claims, 10 Drawing Sheets

Related U.S. Application Data continuation of application No. 16/408,815, filed on May 10, 2019, now Pat. No. 11,075,335.

(60) Provisional application No. 62/736,607, filed on Sep. 26, 2018.

(51) Int. Cl.
| | |
|---|---|
| *H01F 41/32* | (2006.01) |
| *H01L 21/768* | (2006.01) |
| *H01L 23/522* | (2006.01) |
| *H10B 61/00* | (2023.01) |
| *H10N 50/01* | (2023.01) |
| *H10N 50/80* | (2023.01) |

(52) U.S. Cl.
CPC .. *H01L 21/76802* (2013.01); *H01L 21/76819* (2013.01); *H01L 21/7684* (2013.01); *H01L 21/76877* (2013.01); *H01L 23/5226* (2013.01); *H01L 23/528* (2013.01); *H10B 61/22* (2023.02); *H10N 50/80* (2023.02)

(56) References Cited

U.S. PATENT DOCUMENTS

| | | | |
|---|---|---|---|
| 9,502,466 B1 | 11/2016 | Chuang et al. | |
| 9,564,577 B1* | 2/2017 | Hsu | H10N 50/10 |
| 11,075,335 B2 | 7/2021 | Chuang et al. | |
| 2003/0151079 A1 | 8/2003 | Jones et al. | |
| 2013/0010529 A1* | 1/2013 | Hayakawa | H10N 70/041 |
| | | | 257/E45.001 |
| 2013/0015541 A1 | 1/2013 | Kanaya | |
| 2013/0032907 A1 | 2/2013 | Satoh et al. | |
| 2013/0119494 A1 | 5/2013 | Li et al. | |
| 2013/0171742 A1 | 7/2013 | Wang et al. | |
| 2013/0267042 A1 | 10/2013 | Satoh et al. | |
| 2014/0042567 A1 | 2/2014 | Jung et al. | |
| 2015/0008546 A1* | 1/2015 | Sung | H10N 50/01 |
| | | | 257/421 |
| 2016/0027843 A1 | 1/2016 | Kumura | |
| 2016/0072051 A1 | 3/2016 | Iwayama | |
| 2016/0268499 A1 | 9/2016 | You et al. | |
| 2017/0018704 A1 | 1/2017 | Chuang et al. | |
| 2017/0025598 A1 | 1/2017 | Kim | |
| 2017/0054070 A1* | 2/2017 | Bak | H10N 50/80 |
| 2017/0084820 A1 | 3/2017 | Tan et al. | |
| 2017/0194557 A1 | 7/2017 | Chuang et al. | |
| 2017/0222128 A1 | 8/2017 | Sung et al. | |
| 2017/0229646 A1* | 8/2017 | Chou | H10N 70/063 |
| 2017/0256585 A1 | 9/2017 | Kumura | |
| 2017/0317143 A1 | 11/2017 | Chen et al. | |
| 2018/0040814 A1 | 2/2018 | Park | |
| 2018/0123038 A1 | 5/2018 | Lee et al. | |
| 2018/0205002 A1 | 7/2018 | Bak | |
| 2019/0088860 A1* | 3/2019 | Saito | G11C 11/161 |
| 2019/0140019 A1 | 5/2019 | Nagel et al. | |
| 2021/0005807 A1 | 1/2021 | Kwon | |
| 2021/0296384 A1 | 9/2021 | Fukasawa et al. | |

OTHER PUBLICATIONS

Non-Final Office Action dated Apr. 30, 2024 for U.S. Appl. No. 17/381,635.
Non-Final Office Action dated Jun. 12, 2020 for U.S. Appl. No. 16/408,815.
Final Office Action dated Oct. 16, 2020 for U.S. Appl. No. 16/408,815.
Notice of Allowance dated Mar. 15, 2021 for U.S. Appl. No. 16/408,815.
1 Final Office Action dated Nov. 6, 2024, for U.S. Appl. No. 17/381,635.
Non-Final Office Action dated Feb. 12, 2025, for U.S. Appl. No. 17/381,635.
Notice of Allowance dated Jun. 4, 2025 for U.S. Appl. No. 17/381,635.

* cited by examiner

TECHNIQUES FOR MRAM MTJ TOP ELECTRODE CONNECTION

REFERENCE TO RELATED APPLICATIONS

This Application is a Continuation of U.S. application Ser. No. 17/381,635, filed on Jul. 21, 2021, which is a Continuation of U.S. application Ser. No. 16/408,815, filed on May 10, 2019 (now U.S. Pat. No. 11,075,335, issued on Jul. 27, 2021), which claims the benefit of U.S. Provisional Application No. 62/736,607, filed on Sep. 26, 2018. The contents of the above-referenced Patent Applications are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
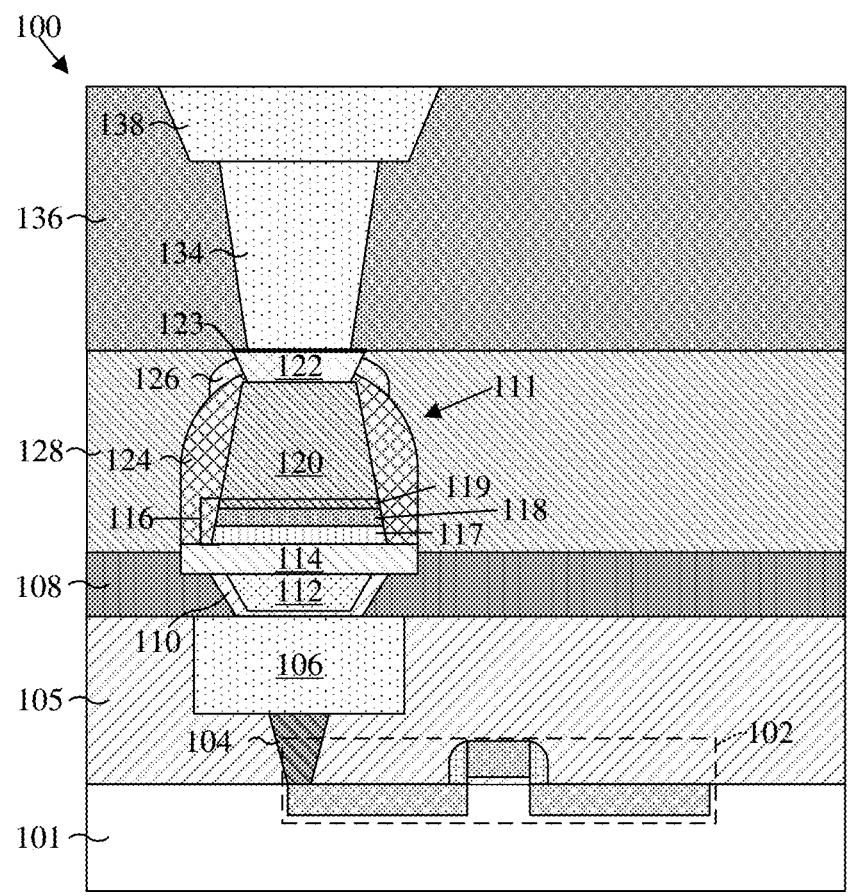
FIG. 1 illustrates a cross-sectional view of some embodiments of a memory device including a MRAM cell having a magnetic tunneling junction (MTJ), according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MRAM cells are generally located within an ILD structure surrounding stacked interconnect layers over a substrate. A magnetoresistive random-access memory (MRAM) cell generally includes a magnetic tunnel junction (MTJ) arranged between top and bottom electrodes. The bottom electrode is coupled to the stacked interconnect layers by a bottom electrode via while the top electrode is coupled to the stacked interconnect layers by a top electrode via. In conventional MRAM cell fabrication, the top electrode via is formed by etching an inter-level dielectric (ILD) arranged over the top electrode to form an opening over the top electrode. The opening is subsequently filled with one or more conductive materials. A photoresist mask is then formed over the conductive material and is used to pattern a top electrode via landing on the top electrode. The top electrode via is subsequently coupled to an overlying metal layer.

It has been appreciated that after patterning, a top surface of the top electrode via exhibits a V-shape defining a recess which will cause defect issues. For example, the V-shape of the top electrode via may result in an increase in resistance due to non-conductive materials forming within the recess defined by the V-shape. The increase in resistance may be due to oxidation occurring between the top electrode via and the overlying metal layer, to a dielectric forming between the top electrode via and the overlying metal layer, and/or to a void left between the top electrode via and the overlying metal layer.

The present disclosure, in some embodiments, relates to a method of forming a MRAM cell that performs a chemical-mechanical planarization process to define a top electrode via having a flat top surface. The new process involves forming an opening over a top electrode and filling the opening with a conductive material layer. Instead of patterning the conductive material layer, a chemical-mechanical planarization process is performed to remove the conductive material outside of the opening and define a top electrode via having a flat upper surface. This removes the defects related to the V-shape recess of the top electrode via and thereby prevents the increase in resistance.

Referring to FIG. 1, a cross-sectional view of a memory device 100 in accordance with some embodiments is provided. The memory device 100 includes a substrate 101 with a first interlayer dielectric (ILD) layer 105 disposed over the substrate 101. A transistor 102 is within the substrate 101. A magnetoresistive random-access memory (MRAM) cell 111 is connected to the transistor 102 via a conductive contact 104. The conductive contact 104 is disposed under an interconnect wire 106.

The MRAM cell 111 comprises a bottom electrode 114 arranged over a bottom electrode via comprising a lower metal layer 112 that is surrounded by a lower dielectric layer 108. The lower metal layer 112 is separated from the lower dielectric layer 108 by a diffusion barrier layer 110. A portion of the bottom electrode 114 is disposed within the lower dielectric layer 108. The MRAM cell 111 further includes a top electrode 120, which is separated from the bottom electrode 114 by a magnetic tunnel junction (MTJ) 116. A top electrode via 122 is disposed over the top electrode 120. The top electrode via 122 has a substantially flat upper surface (e.g., a flat upper surface within a tolerance of a chemical mechanical planarization (CMP) process). For example, in some embodiments, at any point a height of the upper surface of the top electrode via 122 varies within a range of −25 Angstroms and +25 Angstroms from a level horizontal line 123 located between the substantially flat upper surface of the top electrode via 122 and a bottom surface of the second conductive via 134. In other embodiments, at any point a height of the upper surface of the top electrode via 122 varies within a range of −5 Angstroms and +5 Angstroms from the level horizontal line 123. In yet other embodiments, at any point a height of the upper surface of the top electrode via 122 varies within a range of approximately +10% and −10% of a thickness of the top electrode via 122 from the level horizontal line 123. In some embodiments, the top surface of the top electrode via 122 and a top surface of a second ILD layer 128 are coplanar. For example, a level horizontal line extends along a top surface of the top electrode via 122 and a top surface of the second ILD layer 128. In some embodiments, the maximum width of the top electrode via 122 is smaller than the maximum width of the MTJ 116.

The top electrode 120 and MTJ 116 are surrounded by a sidewall spacer 124. In some embodiments, the sidewall spacer 124 may comprise silicon nitride, silicon oxide, silicon carbide, or the like. The top electrode via 122 and sidewall spacer 124 are partially surrounded by an etch stop layer 126. In some embodiments, the etch stop layer 126 may comprise carbon-rich silicon oxycarbide, silicon nitride, silicon carbide, or the like. The second ILD layer 128 surrounds the sidewall spacer 124, the etch stop layer 126, and the top electrode via 122.

The MTJ 116 includes a lower ferromagnetic electrode 117 and an upper ferromagnetic electrode 119, which are separated from one another by a tunneling barrier layer 118. In some embodiments, the lower ferromagnetic electrode 117 may have a fixed or "pinned" magnetic orientation, while the upper ferromagnetic electrode 119 has a variable or "free" magnetic orientation, which may be switched between two or more distinct magnetic polarities that each represents a different data state, such as a different binary state. In other implementations, however, the MTJ 116 may be vertically "flipped", such that the lower ferromagnetic electrode has a "free" magnetic orientation, while the upper ferromagnetic electrode 119 has a "pinned" magnetic orientation.

In some embodiments, the upper ferromagnetic electrode 119 comprises iron, cobalt, nickel, iron cobalt, nickel cobalt, cobalt iron boride, iron boride, iron platinum, iron palladium, or the like. In some embodiments, the upper ferromagnetic electrode 119 has a thickness within a range of between approximately 50 Angstroms and approximately 200 Angstroms. In some embodiments, the tunneling barrier layer 118 provides electrical isolation between the upper ferromagnetic electrode 119 and the lower ferromagnetic electrode 117, while still allowing electrons to tunnel through the tunneling barrier layer 118 under proper conditions. The tunneling barrier layer 118 may comprise, for example, magnesium oxide (MgO), aluminum oxide (e.g., $Al_2O_3$), nickel oxide, gadolinium oxide, tantalum oxide, molybdenum oxide, titanium oxide, tungsten oxide, or the like. In some embodiments, the tunneling barrier layer 118 has a thickness within a range of between approximately 5 Angstroms and approximately 50 Angstroms. In some embodiments, the lower ferromagnetic electrode 117 has a thickness within a range of between approximately 50 Angstroms and approximately 200 Angstroms.

A third ILD layer 136 is disposed over the second ILD layer 128. A second conductive via 134 is disposed over the top electrode via 122. In some embodiments, the second conductive via 134 may be comprised of copper, aluminum, or the like. The second conductive via 134 contacts the substantially flat upper surface of the top electrode via 122 (e.g., a flat upper surface within a tolerance of a chemical mechanical planarization (CMP) process). In some embodiments, the second conductive via 134 may continuously contact the substantially flat upper surface of the top electrode via 122 between outermost sidewalls of the top electrode via 134 of outermost sidewalls of the top electrode via 122 (not shown).

Because the upper surface of the top electrode via 122 is substantially flat, the top electrode via 122 abuts the second conductive via 134 along an interface between two conductive materials, thereby providing for a low resistance between the top electrode via 122 and the overlying second conductive via 134. A first conductive wire 138 is disposed over the second conductive via 134. In some embodiments, the first conductive wire 138 may be comprised of copper, for example. The first conductive wire 138 is surrounded by the third ILD layer 136 and extends past sidewalls of the second conductive via 134.

Figure 2A:
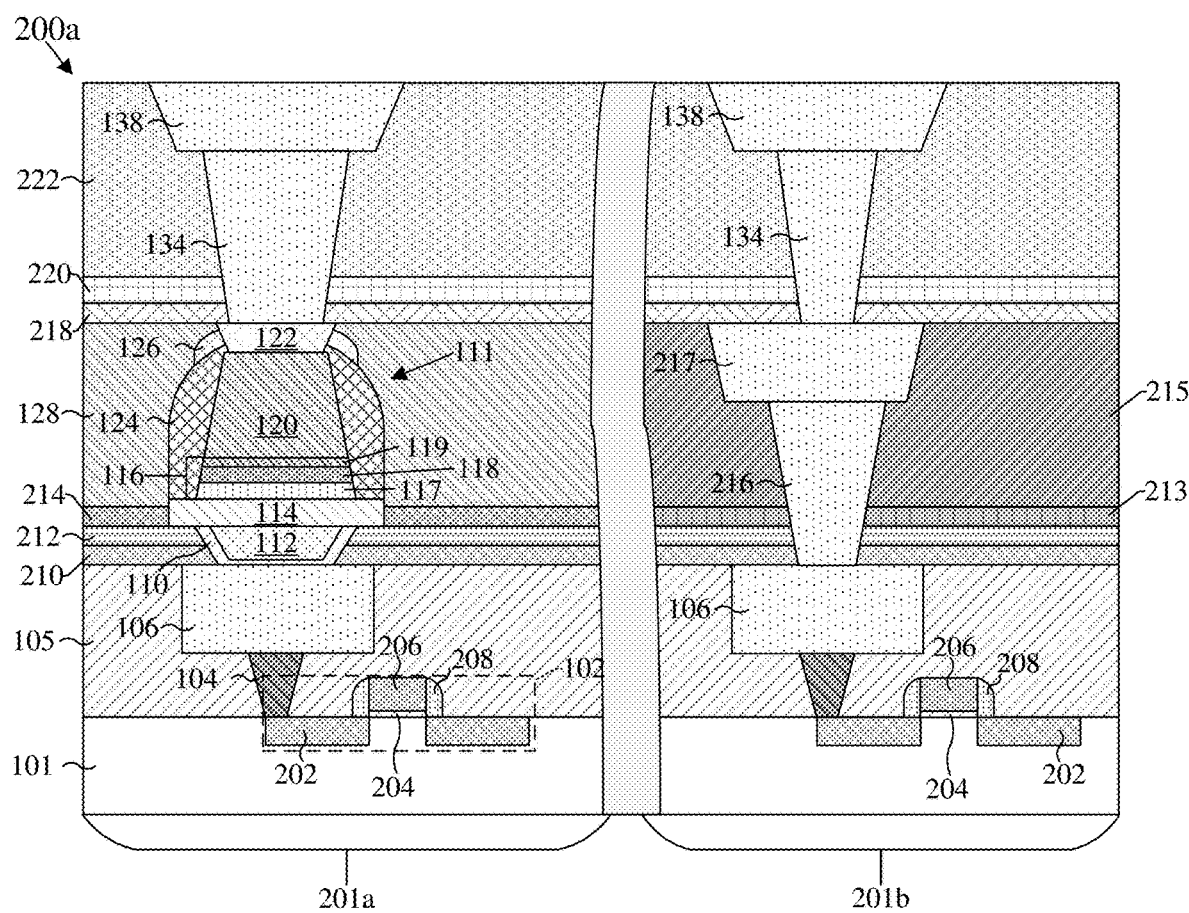
FIGS. 2A-2B illustrate cross-sectional views of some embodiments of an integrated chip including an embedded memory region comprising a MRAM cell having a magnetic tunneling junction (MTJ) and a logic region, according to the present disclosure.

FIG. 2A illustrates a cross-sectional view of some additional embodiments of an integrated chip 200a having an embedded memory region 201a and a logic region 201b. The integrated chip 200a includes a substrate 101. The substrate 101 may be, for example, a bulk substrate (e.g., a bulk silicon substrate) or a silicon-on-insulator (SOI) substrate.

A transistor 102 is within the substrate 101 and first ILD layer 105. The transistor 102 is comprised of a gate electrode 206, transistor sidewall spacers 208, a gate dielectric 204, and source/drain regions 202. An interconnect wire 106 is connected to the transistor 102 via a conductive contact 104. In some embodiments, the conductive contact 104 may be comprised of tungsten, copper, aluminum, or the like. In some embodiments, the interconnect wire 106 may be comprised of copper, aluminum, or the like. In some embodiments, the contacts, vias, and interconnect wires described herein may further comprise barrier layers (e.g., diffusion barrier layers).

A dielectric layer 210 is disposed over the interconnect wire 106 and the first ILD layer 105. In some embodiments, the dielectric layer 210 may comprise silicon carbide, silicon oxide, silicon oxycarbide, or the like. In some embodiments, the dielectric layer 210 has a thickness within a range of approximately 50 Angstroms and 500 Angstroms. A second etch stop layer 212 is disposed over the dielectric layer 210.

The second etch stop layer 212 may comprise a different material than the dielectric layer 210. In some embodiments, the second etch stop layer 212 may comprise silicon rich oxide, silicon nitride, silicon carbide, silicon rich nitride, or the like. In some embodiments, the second etch stop layer 212 has a thickness within a range of approximately 50 Angstroms and approximately 500 Angstroms.

In the embedded memory region 201a, an upper dielectric layer 214 is disposed over the second etch stop layer 212. In some embodiments, the upper dielectric layer 214 may comprise a same material as the dielectric layer 210. For example, the upper dielectric layer 214 may comprise silicon oxycarbide, carbon-rich silicon oxycarbide, silicon nitride, or the like. A second ILD layer 128 is arranged over the upper dielectric layer 214 and surrounds a part of a bottom electrode 114, a magnetic tunnel junction (MTJ) 116, and an overlying top electrode via 122. In some embodiments, the second ILD layer 128 has a thickness within a range of between approximately 750 Angstroms and approximately 2000 Angstroms. In some embodiments, the bottom electrode 114 and the top electrode 120 may comprise a conductive material, such as, titanium nitride, tantalum nitride, titanium, tantalum, or the like. An etch stop layer 126 may partially surround sidewalls of the top electrode via 122. In some embodiments, a top surface of the etch stop layer 126 may be below a top surface of the top electrode via 122. In other embodiments, the top surface of the etch stop layer 126 may be aligned with the top surface of the top electrode via 122. The bottom electrode 114 is disposed below the top electrode via 122. In some embodiments, outermost sidewalls of the top electrode via 122 are within outermost sidewalls of the bottom electrode 114. In some embodiments, the bottom electrode 114 has a thickness within a range of between approximately 50 Angstroms and approximately 500 Angstroms and a width within a range of between approximately 200 Angstroms and approximately 1500 Angstroms.

In the logic region 201b, a second dielectric layer 213 is disposed over the second etch stop layer 212. In some embodiments, the second dielectric layer 213 may comprise tetra-ethyl-ortho-silicate (TEOS) (e.g., plasma enhanced TEOS, low particle TEOS, etc.), an oxide (e.g., silicon oxide, silicon dioxide, etc.), a nitride, or the like. A fourth ILD layer 215 is disposed over the second dielectric layer 213. In some embodiments, the fourth ILD layer 215 may comprise a different material than the second ILD layer 128. For example, in some embodiments, the fourth ILD layer 215 may comprise a dielectric material having a first dielectric constant (e.g., a low-k dielectric layer) and the second ILD layer 128 may comprise dielectric material having a second dielectric constant (e.g., a low-k dielectric layer) that is lower than the first dielectric constant. A third conductive via 216 is disposed over the interconnect wire 106. In some embodiments, the third conductive via 216 may be comprised of copper, aluminum, or the like. A second conductive wire 217 is disposed over the third conductive via 216. In some embodiments, the second conductive wire 217 may be comprised of copper, aluminum, or the like. The second conductive wire 217 is surrounded by the fourth ILD layer 215 and extends past sidewalls of the third conductive via 216. A level horizontal line extends along a top surface of the top electrode via 122 and a top surface of the second conductive wire 217.

A third etch stop layer 218 is disposed over the second ILD layer 128 and fourth ILD layer 215. In some embodiments, the third etch stop layer 218 may comprise silicon carbide, silicon oxycarbide, silicon nitride, silicon oxynitride, or the like. In some embodiments, the third etch stop layer 218 has a substantially flat bottom surface that extends over the top electrode via 122. In some embodiments, an entirety of the third etch stop layer 218 is arranged over the top electrode via 122. A third dielectric layer 220 is disposed over the third etch stop layer 218. In some embodiments, the third dielectric layer 220 may comprise TEOS (e.g., plasma enhanced TEOS, low particle TEOS, etc.), an oxide (e.g., silicon oxide, silicon dioxide, etc.), a nitride, or the like. In some embodiments, the third dielectric layer 220 has a thickness within a range of between approximately 50 Angstroms and approximately 500 Angstroms. A fifth ILD layer 222 is disposed over the third dielectric layer 220. In some embodiments, the fifth ILD layer 222 may comprise a different material than the second ILD layer 128 that surrounds the MRAM cell 111. For example, in some embodiments, the fifth ILD layer 222 may comprise a dielectric material having a third dielectric constant (e.g., a low-k dielectric layer) and the second ILD layer 128 may comprise dielectric material having a fourth dielectric constant (e.g., an ultra low-k dielectric layer) that is lower than the third dielectric constant.

A level horizontal line extends along the top surface of the top electrode via 122, a top surface of the second ILD layer 128, a top surface of the fourth ILD layer 215, and the top surface of the second conductive wire 217. A second conductive via 134 is disposed over the top electrode via 122. In some embodiments, the second conductive via 134 may be comprised of copper, aluminum, or the like. The second conductive via 134 contacts the substantially flat upper surface of the top electrode via 122. The second conductive via 134 may be set back from one or more outermost sidewalls of the top electrode via 122 by a non-zero distance. In some embodiments, a bottommost surface of the second conductive via 134 may be arranged over a topmost surface of the top electrode via 122. A first conductive wire 138 is disposed over the second conductive via 134. In some embodiments, the first conductive wire 138 may be comprised of copper, aluminum, or the like. The first conductive wire 138 extends from over the second conductive via 134 past one or more outermost sidewalls of the second conductive via 134.

In some embodiments, a bottommost surface of the second conductive via 134 contacts a topmost surface of the top electrode via 122. In some embodiments, a width of the bottommost surface of the second conductive via 134 is less than a width of the topmost surface of the top electrode via 122. In such embodiments, a bottom surface of the third etch stop layer 218 also contacts a portion of the topmost surface of the top electrode via 122. In some embodiments, the third etch stop layer 218 has a thickness within a range of between approximately 50 Angstroms and approximately 500 Angstroms. The top surface of the second ILD layer 128 is aligned along a horizontal plane with the top surface of the top electrode via 122.

In the logic region 201b, the second conductive via 134 is disposed over the second conductive wire 217. The first conductive wire 138 is disposed over the second conductive via 134. The first conductive wire 138 is surrounded by the fifth ILD layer 222 and extends past sidewalls of the second conductive via 134. In some embodiments, the first ILD layer 108, the second ILD layer 128, the third ILD layer 215, and/or the fifth ILD layer 222 may comprise an oxide (e.g., silicon oxide), borosilicate glass (BSG), phosphosilicate glass (PSG), or the like.

In some embodiments, the MRAM cell 111 within the embedded memory region 201a may be comprised within an array having a plurality of MRAM cells arranged in rows and columns. A top electrode via 122 of a first one of the plurality of MRAM cells may have a top surface defining a recess arranged directly over an MTJ, while a top electrode via 122 of a second one of the plurality of MRAM cells may have a flat top surface (i.e., a surface that is flat within a tolerance of a CMP process). The recess within the first one of the plurality of MRAM cells is due to irregularities within a CMP process used to form the MRAM cells.

Figure 2B:
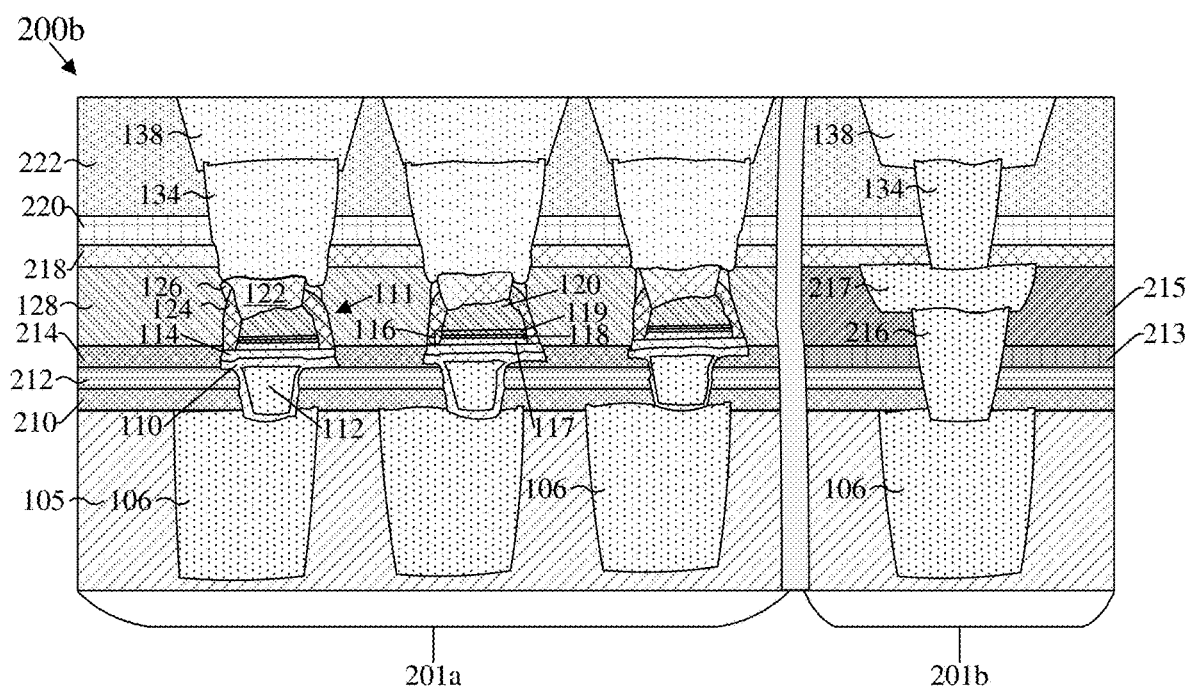

FIG. 2B illustrates a cross-sectional view of some alternative embodiments of an integrated chip 200b having an embedded memory region 201a and a logic region 201b.

The integrated chip 200b includes MRAM cells 111 arranged within an embedded memory region 201a. The MRAM cells 111 comprise a bottom electrode 114 arranged over a lower metal layer 112 and a diffusion barrier layer 110. In some embodiments, the diffusion barrier layer 110 completely surrounds the lower metal layer 112. In some embodiments, the lower metal layer 112 is laterally offset from a center of the bottom electrode 114.

The MRAM cell 111 further comprises a MTJ 116 and an overlying top electrode 120. A top electrode via 122 is arranged on the top electrode 120. In some embodiments, the top electrode via 122 has a substantially flat upper surface (e.g., an upper surface that is within a range of between approximately +10% and approximately −10% of a thickness of the top electrode via 122 from a level horizontal line located between the substantially flat upper surface of the top electrode via 122 and a bottom surface of a second conductive via 134). In some embodiments, the second conductive via 134 may extend from directly over the top electrode via 122 to laterally past one or more sides of the top electrode via 122. In some embodiments, the second conductive via 134 may extend below a top of the top electrode via 122.

FIGS. 3-14 illustrate cross-sectional views 300-1400 of some embodiments of a method of forming a memory device including an embedded memory region comprising a MRAM cell and MTJ, and a logic region according to the present disclosure. Although the cross-sectional views 300-1400 shown in FIGS. 3-14 are described with reference to a method, it will be appreciated that the structures shown in FIGS. 3-14 are not limited to the method but rather may stand alone separate of the method. Although FIGS. 3-14 are described as a series of acts, it will be appreciated that these acts are not limiting in that the order of the acts may be altered in other embodiments, and the methods disclosed are also applicable to other structures. In other embodiments, some acts that are illustrated and/or described may be omitted in whole or in part.

Figure 3:
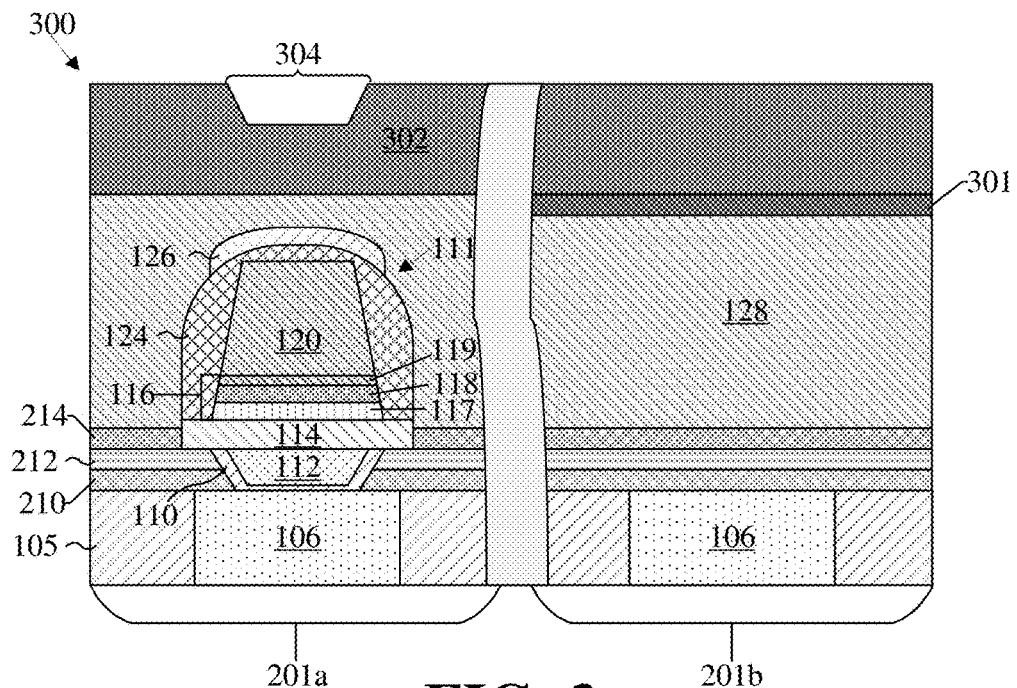
FIGS. 3-14 illustrate cross-sectional views of some embodiments of a method of forming a memory device including an embedded memory region comprising a MRAM cell having a MTJ and a logic region, according to the present disclosure.

As shown in cross-sectional view 300 of FIG. 3, a first ILD layer 105 is formed over a substrate 101 and an interconnect wire 106 is formed within the first ILD layer 105 in the embedded memory region 201a and in the logic region 201b. A dielectric layer 210 is formed over the interconnect wire 106 and first ILD layer 105. In some embodiments, the dielectric layer 210 comprises SiC (silicon carbide) formed to a thickness within a range of between approximately 200 Angstroms and approximately 300 Angstroms. A second etch stop layer 212 is formed over the dielectric layer 210. In some embodiments, the second etch stop layer 212 comprises silicon rich oxide formed to a thickness within a range of between approximately 150 Angstroms and approximately 250 Angstroms. An upper dielectric layer 214 is formed over the second etch stop layer 212. In some embodiments, the upper dielectric layer 214 comprises silicon oxycarbide or carbon-rich silicon oxycarbide formed to a thickness within a range of between approximately 50 Angstroms and approximately 500 Angstroms.

Within the embedded memory region 201a, a MRAM cell 111 is formed over the interconnect wire 106. The MRAM cell 111 includes a top electrode 120, which is separated from the bottom electrode 114 by an MTJ 116 including a lower ferromagnetic electrode 117 separated from an upper ferromagnetic electrode 119 by a tunneling barrier layer 118. In some embodiments, the bottom electrode 114 and the top electrode 120 may comprise a conductive material, such as, titanium nitride, tantalum nitride, titanium, tantalum, or a combination of one or more of the foregoing. In some embodiments, the top electrode 120 has a thickness within a range of between approximately 300 Angstroms and approximately 800 Angstroms. Sidewalls of the MTJ 116 and/or top electrode 120 may be angled at an angle of other than 90-degrees as measured relative to a normal line passing through an upper surface of the bottom electrode 114. The MTJ 116 and top electrode 120 are surrounded by a sidewall spacer 124. In some embodiments, the sidewall spacer 124 is partially surrounded by an etch stop layer 126. Although the MRAM cell 111 is illustrated in FIG. 3 as being over a first interconnect wire, it will be appreciated that in other embodiments, the MRAM cell 111 may be located at other positions within a back-end-of-the-line (BEOL) metallization stack (e.g., the MRAM cell 111 may be between a second and third interconnect wire, between a third and fourth interconnect wire, etc.). A second ILD layer 128 is formed over the embedded memory and logic regions.

In some embodiments, the MRAM cell 111 may be formed by selectively etching the upper dielectric layer 214 to form an opening and subsequently depositing a conductive material (e.g., a metal) within the opening. The conductive material is subsequently patterned to define the bottom electrode 114. A lower ferromagnetic electrode film, a tunnel barrier film, a ferromagnetic electrode film, and a top electrode film are sequentially deposited over the bottom electrode 114. The lower ferromagnetic electrode film, the tunnel barrier film, the ferromagnetic electrode film and the top electrode film are subsequently patterned according to a masking layer (e.g., a hard mask layer) to form a the top electrode 120 and a patterned MRAM stack comprising the lower ferromagnetic electrode 117, the tunneling barrier layer 118, and the upper ferromagnetic electrode 119. The masking layer is removed and a sidewall spacer material is formed over the patterned MRAM stack and the top electrode 120. The sidewall spacer material is subsequently etched to leave the sidewall spacer 124 along sidewalls of the MTJ 116. An etch stop layer 126 is formed over the sidewall spacer 124 and the second ILD layer is deposited over and around the sidewall spacer 124 and the etch stop layer 126.

In some embodiments, within the logic region 201b, a dielectric protection layer 301 is formed over the second ILD layer 128. In some embodiments, the dielectric protection layer 301 comprises silicon oxynitride having a thickness in a range of between approximately 150 Angstroms and approximately 250 Angstroms. A masking layer 302 is formed over the second ILD layer 128. The masking layer 302 exhibits sidewalls defining an opening 304 disposed above the top electrode 120 of the MRAM cell 111. The opening 304 at an upper surface of the masking layer 302 has a first width, the surface at the bottommost point of the opening 304 in the masking layer 302 has a second width, and the first width is greater than the second width.

In some embodiments, the masking layer 302 includes a photoresist mask. In other embodiments, the masking layer 302 may comprise a hardmask layer (e.g., comprising a nitride layer). In some embodiments, the masking layer 302 may comprise a multi-layer hard mask. For example, in some embodiments, the masking layer may comprise a dual-layer hard mask having an upper-layer and a lower-layer. In some embodiments, the lower-layer comprises a titanium nitride (TiN) layer and the upper-layer comprises TEOS.

Figure 4:
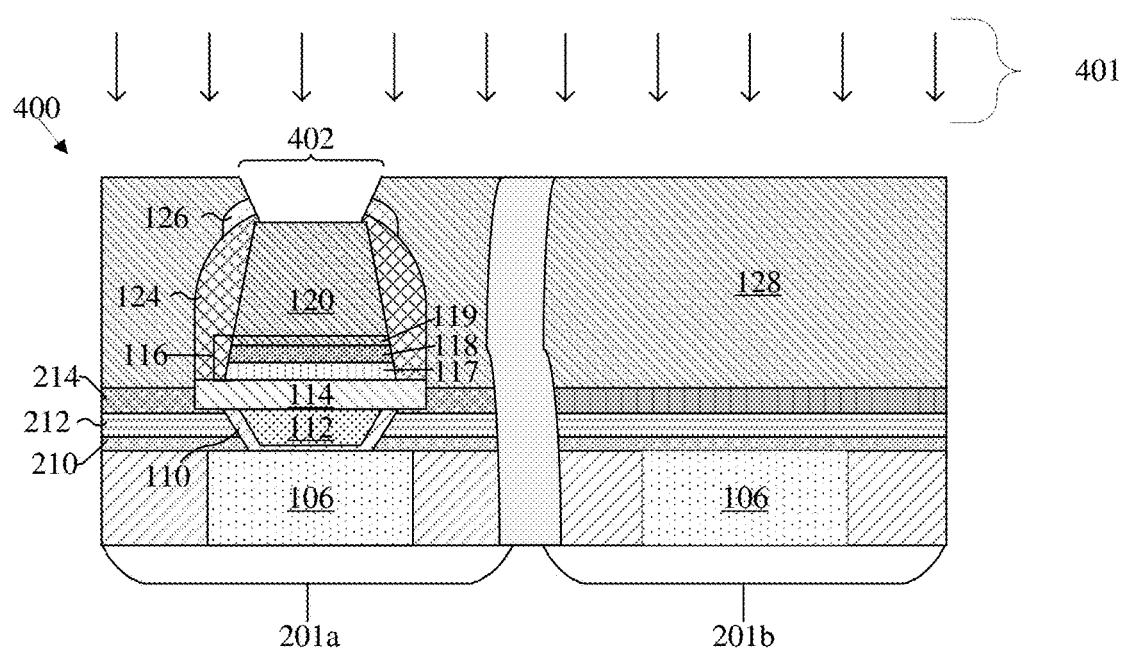

As shown in cross-sectional view 400 of FIG. 4, an etching process is performed to etch the masking layer 302, the second ILD layer 128, the etch stop layer 126, the sidewall spacer 124, and the dielectric protection layer 301. Because opening 304 is recessed below a top of the masking layer 302, the etching process will etch the second ILD layer 128, the etch stop layer 126, and the sidewall spacers 124 to form an opening 402 that extends to below a top of the second ILD layer 402. The opening 402 exposes a top surface of the top electrode 120. The etching process may be performed by exposing the masking layer (302 of FIG. 3), the second ILD layer 128, the etch stop layer 126, the sidewall spacer 124, and the dielectric protection layer 301 to an etchant 401.

Figure 5:
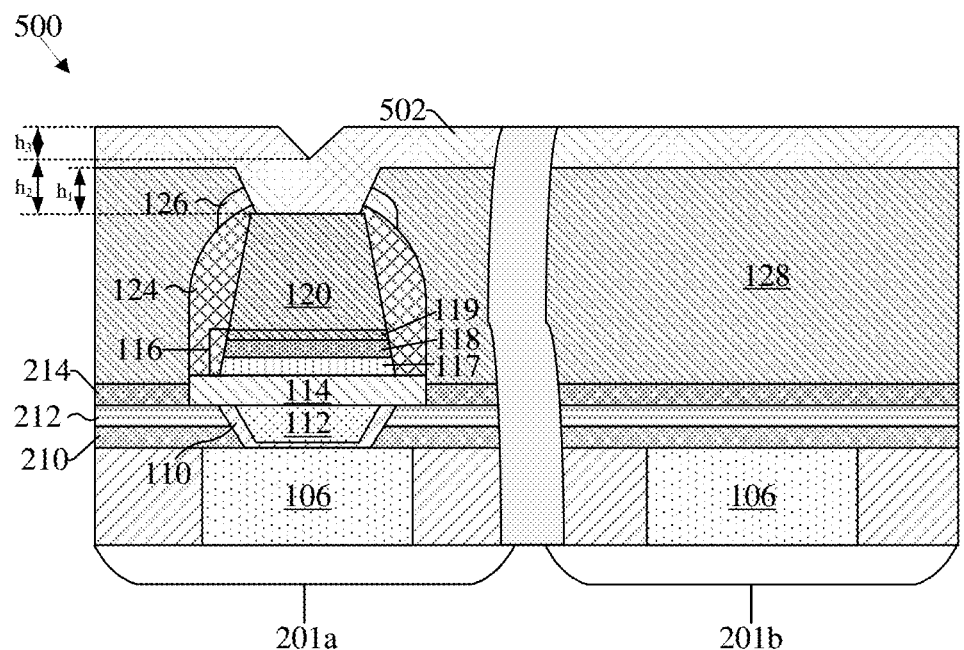

As shown in cross-sectional view 500 of FIG. 5, a top electrode via layer 502 is formed within the opening 402 above the top electrode 120 and over the second ILD layer 128. In some embodiments, the top electrode via layer 502 may be formed by chemical vapor deposition (CVD) such as MOCVD, physical vapor deposition (PVD), atomic layer deposition (ALD), a plating process (e.g., an electroplating process), or the like. In some embodiments, the top electrode via layer 502 may comprise a titanium, tantalum, titanium nitride, tantalum nitride, or the like. The top electrode via layer 502 has a thickness in a range of between approximately 50 Angstroms and approximately 2000 Angstroms. A V-shaped recess is formed in a top surface of the top electrode via layer 502 directly above the top electrode 120. In some embodiments, a height $h_1$ between a top surface of the top electrode 120 and a top surface of the second ILD layer 128 is less than the height $h_2$ between the top surface of the top electrode 120 and a bottommost point of the V-shaped recess. For example, the height $h_1$ is in a range of approximately 50 Angstroms and 1000 Angstroms. The height $h_2$ is in a range of approximately 50 Angstroms and 2000 Angstroms. A difference in height $\Delta h$ ($\Delta h=|h_2-h_1|$) is in a range of approximately 0 Angstroms and 1000 Angstroms. In such embodiments, the bottom most point of the V-shaped recess of the top electrode via layer 502 is above a top surface of the second ILD layer 128. A height $h_3$ is defined between the top surface of the top electrode via layer 502 and the bottommost point of the V-shaped recess. The height $h_3$ is within a range of approximately 0 Angstroms and 200 Angstroms. In other embodiments, height hi that is greater than the height $h_2$ (not shown). In some embodiments, a MRAM array may comprise a plurality of MRAM cells 111 having a top electrode with a flat upper surface (formed with a top electrode having a height $h_1<h_2$) and one or more MRAM cells 111 having a top electrode with an upper surface comprising a recess (formed with a top electrode having a height $h_1>h_2$).

Figure 6:
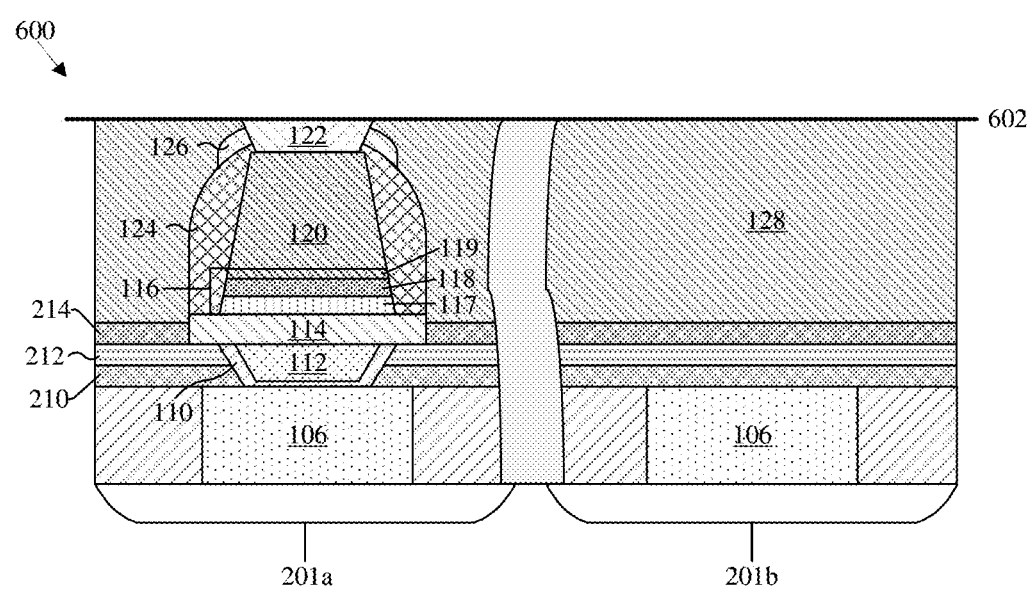

As shown in cross-sectional view 600 of FIG. 6, a chemical-mechanical planarization (CMP) process is preformed along line 602 to remove a portion of the top electrode via layer (e.g., 502 of FIG. 5) and define a top electrode via 122. The line 602 is defined between a bottom surface of the top electrode via layer (502 of FIG. 5) and a top surface of the second ILD layer 128 in the logic region 201b. The line 602 is a flat horizontal line that extends from the logic region 201b through the embedded memory region 201a. After the planarization process is completed, the top electrode via 122 has a thickness within a range of approximately 50 Angstroms and 1000 Angstroms. The CMP process planarizes the upper surface of the top electrode via 122 and second ILD layer 128, so that the top electrode via 122 has a substantially flat upper surface (e.g., a flat upper surface within a tolerance of a CMP process). A level horizontal line extends along the top surface of the top electrode via 122 and the top surface of the second ILD layer 128. In some embodiments, the top surface of the top electrode via 122 defines a recess over the MRAM cell 111. In some embodiments, a maximum width of the top electrode via 122 is smaller than the maximum width of the MTJ 116.

In some embodiments, the line 602 is defined between a top surface of the second ILD layer 128 and a top surface of the etch stop layer 126 (not shown). In such embodiments, the CMP planarizes the upper surface of the top electrode via 122 and the second ILD layer 128, a portion of the second ILD layer 128 is removed. The top electrode via 122 has a substantially flat upper surface (e.g., a flat upper surface within a tolerance of a CMP process).

Figure 7:
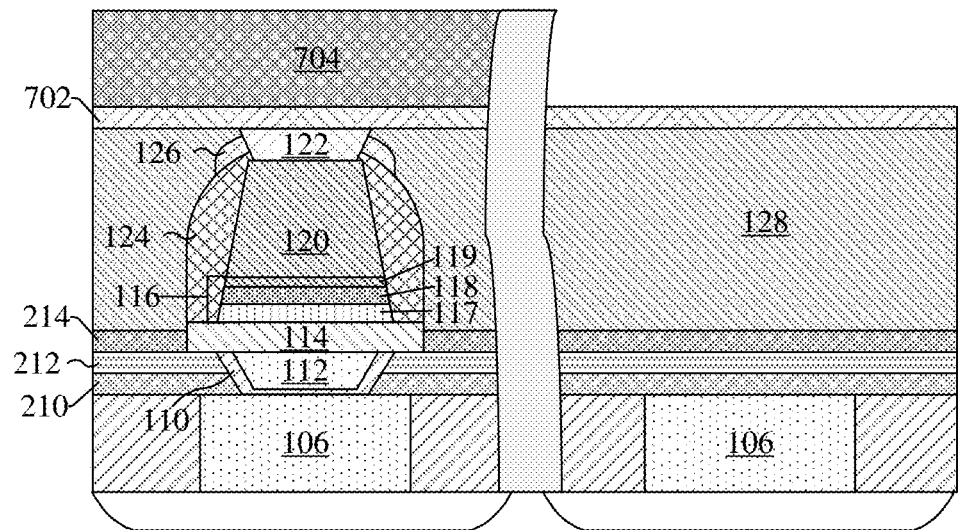

As shown in cross-sectional view 700 of FIG. 7, a fourth etch stop layer 702 is formed over the second ILD layer 128, for example, by chemical vapor deposition (CVD), physical vapor deposition (PVD), an atomic layer deposition (ALD), or the like. In some embodiments, the fourth etch stop layer 702 may comprise a silicon carbide layer having a thickness in a range of between approximately 150 Angstroms and approximately 250 angstroms. A second masking layer 704 is formed over the fourth etch stop layer 702 within the embedded memory region 201a. In some embodiments, the second masking layer 704 includes a photoresist mask, but may also be a hardmask such as a nitride mark. In some embodiments, the second masking layer 704 is formed by chemical vapor deposition (CVD), physical vapor deposition (PVD), or the like.

Figure 8:
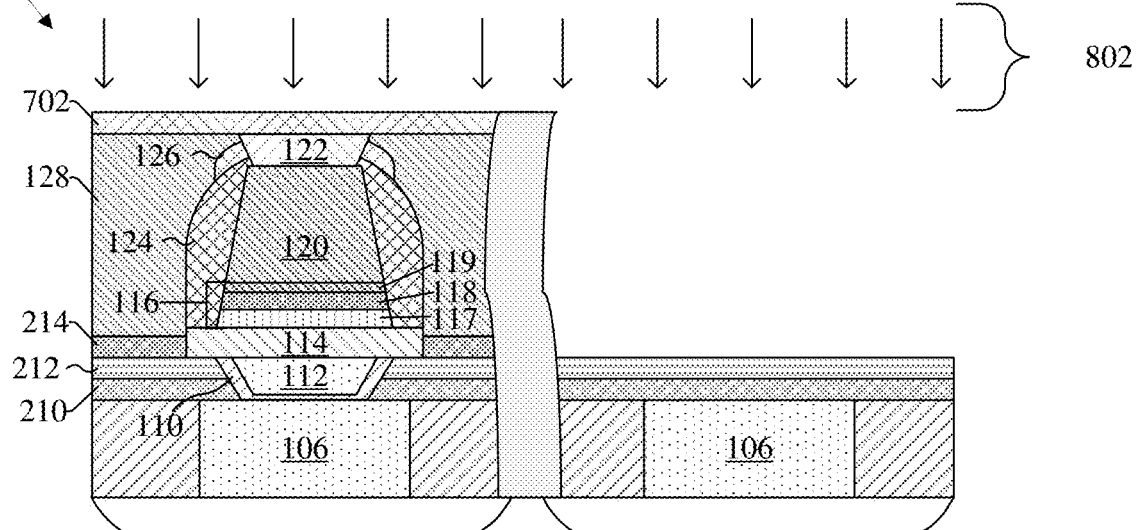

As shown in cross-sectional view 800 of FIG. 8, the fourth etch stop layer 702, the second ILD layer 128, and the upper dielectric layer 214 are removed within the logic region 201b. In some embodiments, the fourth etch stop layer 702, the second ILD layer 128, and the upper dielectric layer 214 may be removed by selectively exposing unmasked parts of the fourth etch stop layer 702, the second ILD layer 128, and the upper dielectric layer 214 to an etchant 802 within the logic region 201b that is not covered by the second masking layer 704. In some embodiments, the second masking layer 704 within the embedded memory region 201a may be removed after the etching process is completed by an ashing process or by a wet etchant (e.g., acetone).

Figure 9:
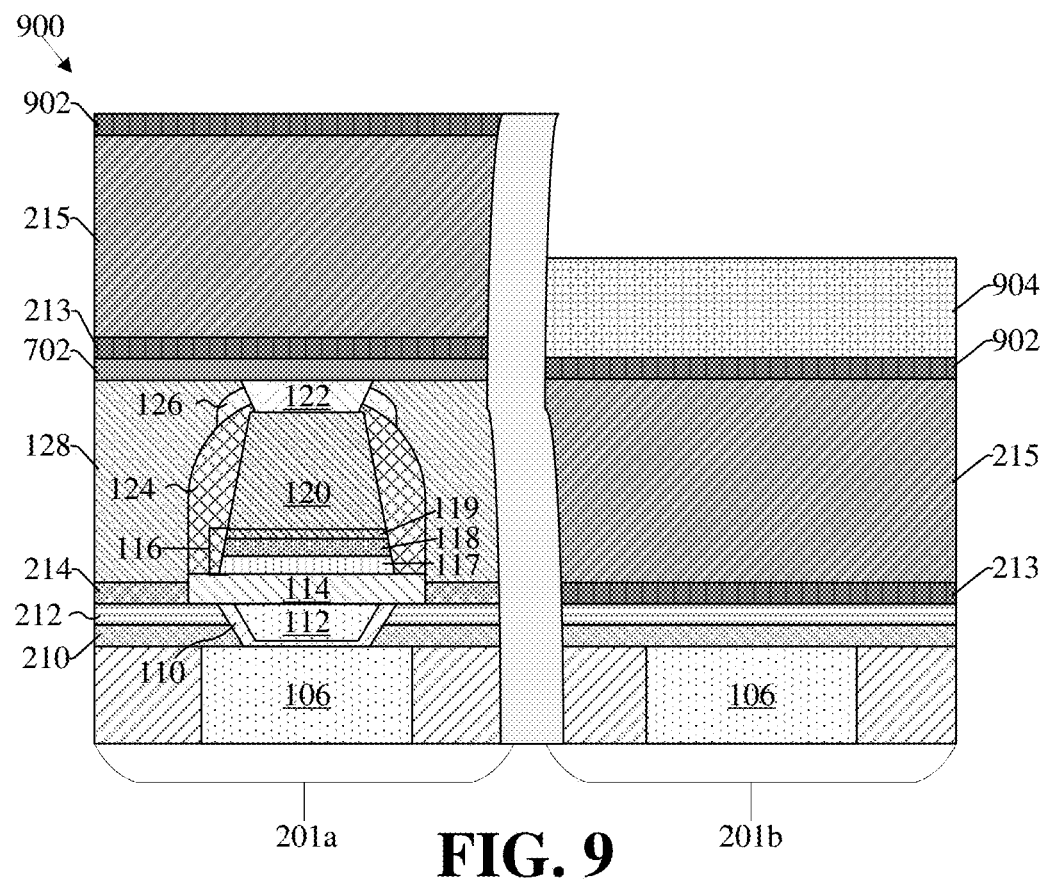

As shown in cross-sectional view 900 of FIG. 9, a second dielectric layer 213 is formed over the second etch stop layer 212 and the fourth etch stop layer 702. In some embodiments, the second dielectric layer 213 may comprise a TEOS layer having a thickness in a range of between approximately 100 Angstroms and approximately 200 Angstroms. A fourth ILD layer 215 is formed over the second dielectric layer 213. In some embodiments, the fourth ILD layer 215 may comprise a different material than a second ILD layer 128 that surrounds the MRAM cell 111. For example, in some embodiments, the fourth ILD layer 215 may comprise a dielectric material having a first dielectric constant (e.g., a low-k dielectric layer) and the second ILD layer 128 may comprise dielectric material having a second dielectric constant (e.g., an ultra low-k dielectric layer) that is lower than the first dielectric constant. The fourth ILD layer 215 has a thickness within a range of approximately 1200 Angstroms and approximately 2300 Angstroms. A top dielectric layer 902 is formed over the fourth ILD layer 215. In some embodiments, the top dielectric layer 902 may comprise a TEOS layer having a thickness of in a range of approximately 50 Angstroms and approximately 500 Angstroms. Within the logic region 201*b*, a third masking layer 904 is formed over the top dielectric layer 902. In some embodiments, the third masking layer 904 includes a positive photoresist mask having a thickness of approximately 2000 Angstroms. The positive photoresist mask provide for a better control of the overlay between the logic region 201*b* and the embedded memory region 201*a* than a negative photoresist. For example, the positive photoresist mask may provide for an overlay in a range of between −30 nm and +30 nm. The use of the positive photoresist mask prevents damage from occurring to the fourth ILD layer 215 in the logic region 201*b*.

Figure 10:
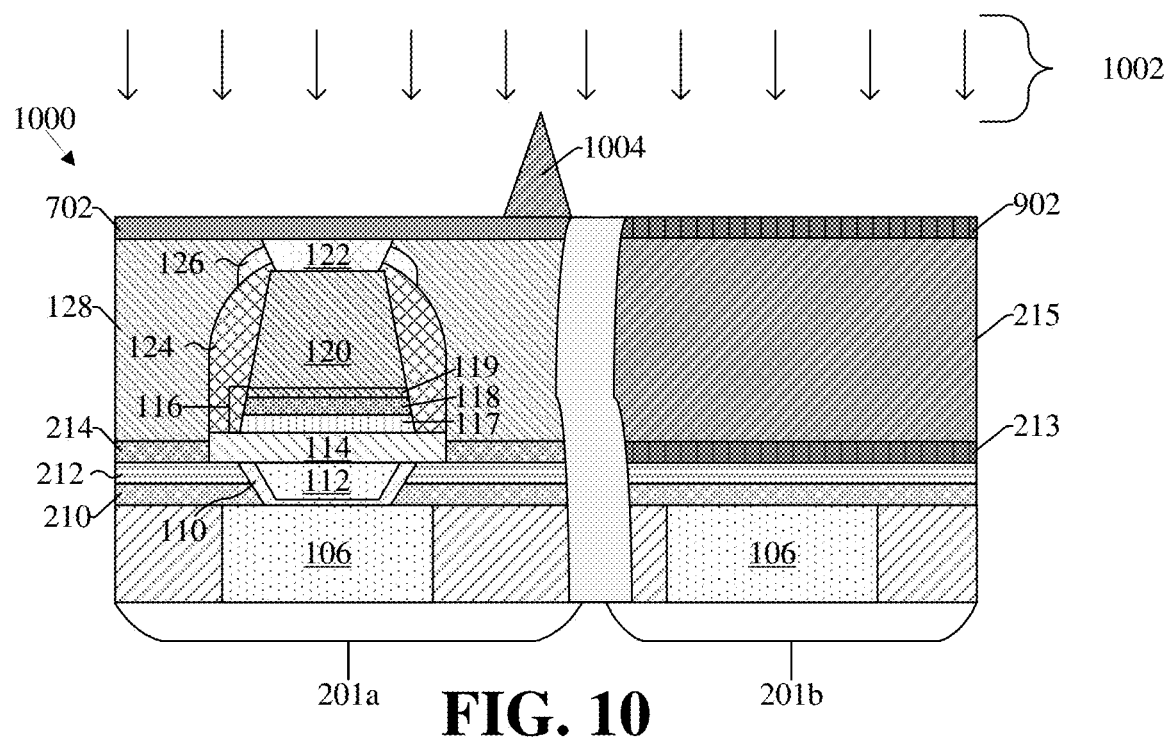

As shown in cross-sectional view 1000 of FIG. 10, the top dielectric layer 902, the fourth ILD layer 215, and the second dielectric layer 213 are removed within the embedded memory region 201*a*. In some embodiments, the top dielectric layer 902, the fourth ILD layer 215, and the second dielectric layer 213 may be removed by selectively exposing the top dielectric layer 902, the fourth ILD layer 215, and the second dielectric layer 213 to an etchant 1002 according to the third masking layer 904 within the logic region 201*b*. In some embodiments, the third masking layer 904 may overlap one or more of the top dielectric layer 902, the fourth ILD layer 215, and the second dielectric layer 213 along an edge of the logic region 201*b* and/or the embedded memory region 201*a*. In such embodiments, the etchant 1002 may result in a protrusion 1004 comprising a remnant of the fourth ILD layer 215 remaining between the logic region 201*b* and embedded memory region 201*a*. In some embodiments, the protrusion 1004 may also comprise a remnant of the second dielectric layer 213. In some embodiments, the protrusion 1004 comprises a triangular shape. In some alternative embodiments (not shown), the protrusion 1004 may be located in the logic region 201*b* or between the logic region 201*b* and the embedded memory region 201*a*

Figure 11:
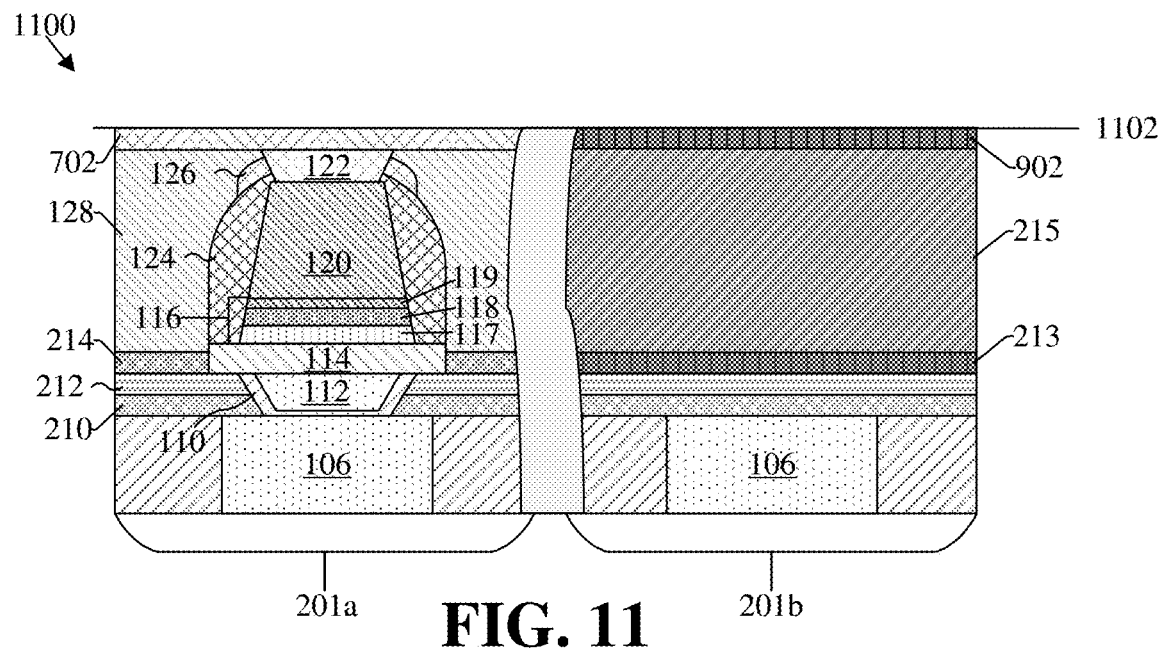

As shown in cross-sectional view 1100 of FIG. 11, a CMP process is preformed along line 1102 to remove the protrusion 1004. The line 1102 is a level horizontal line aligned with a top surface of the top dielectric layer 902 and a top surface of the fourth etch stop layer 702. In some embodiments, the CMP process may be carried out for a time of between 5 seconds and 30 seconds. For example, in one embodiments, the CMP process is carried out for approximately 10 seconds. In some embodiments, a portion of the fourth etch stop layer 702 and a portion of the top dielectric layer 902 are also removed during the CMP process.

Figure 12:
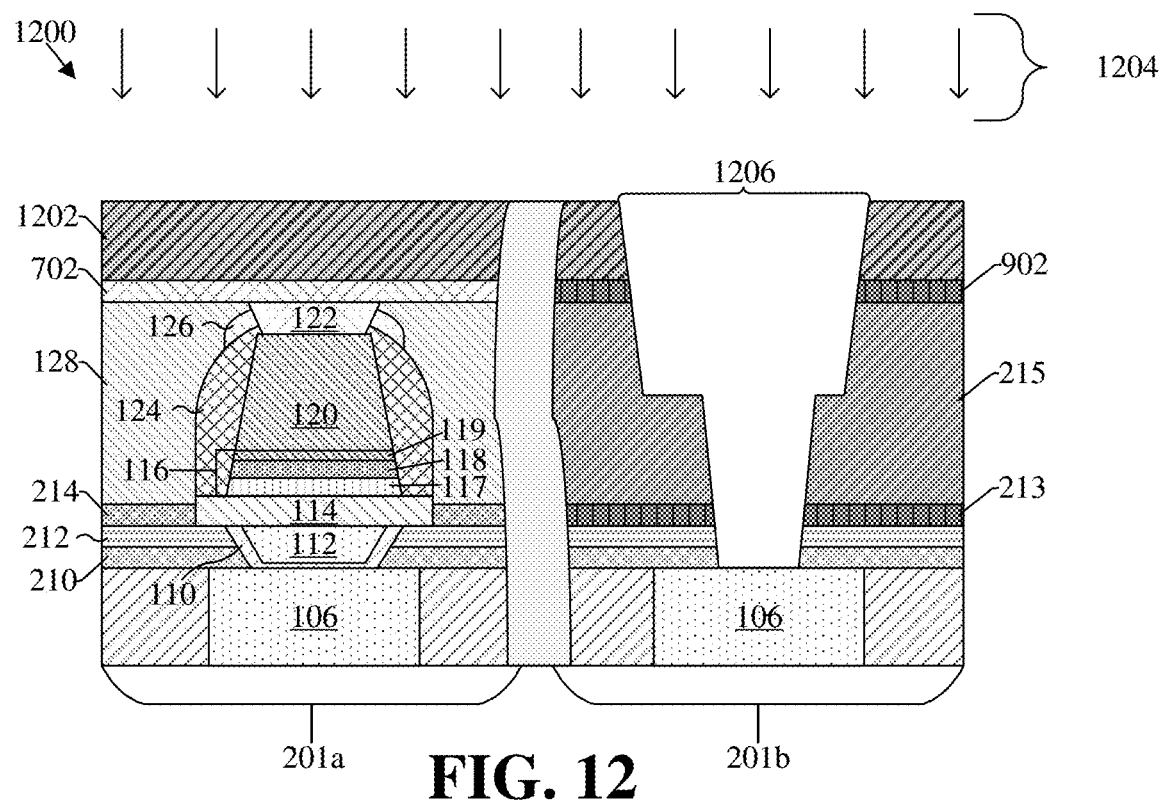

As shown in cross-sectional view 1200 of FIG. 12, a fourth masking layer 1202 is formed over the embedded memory region 201*a* and logic region 201*b*. In some embodiments, the fourth masking layer 1202 includes a photoresist mask, but may also be a hardmask such as a nitride mark (e.g., TiN). The fourth masking layer 1202 exhibits sidewalls defining an opening disposed above the interconnect wire 106 within the logic region 201*b*. An etching process 1204 is carried out to form an opening 1206 that extends through the fourth ILD layer 215 to expose an upper surface of the interconnect wire 106 within the logic region 201*b*.

Figure 13:
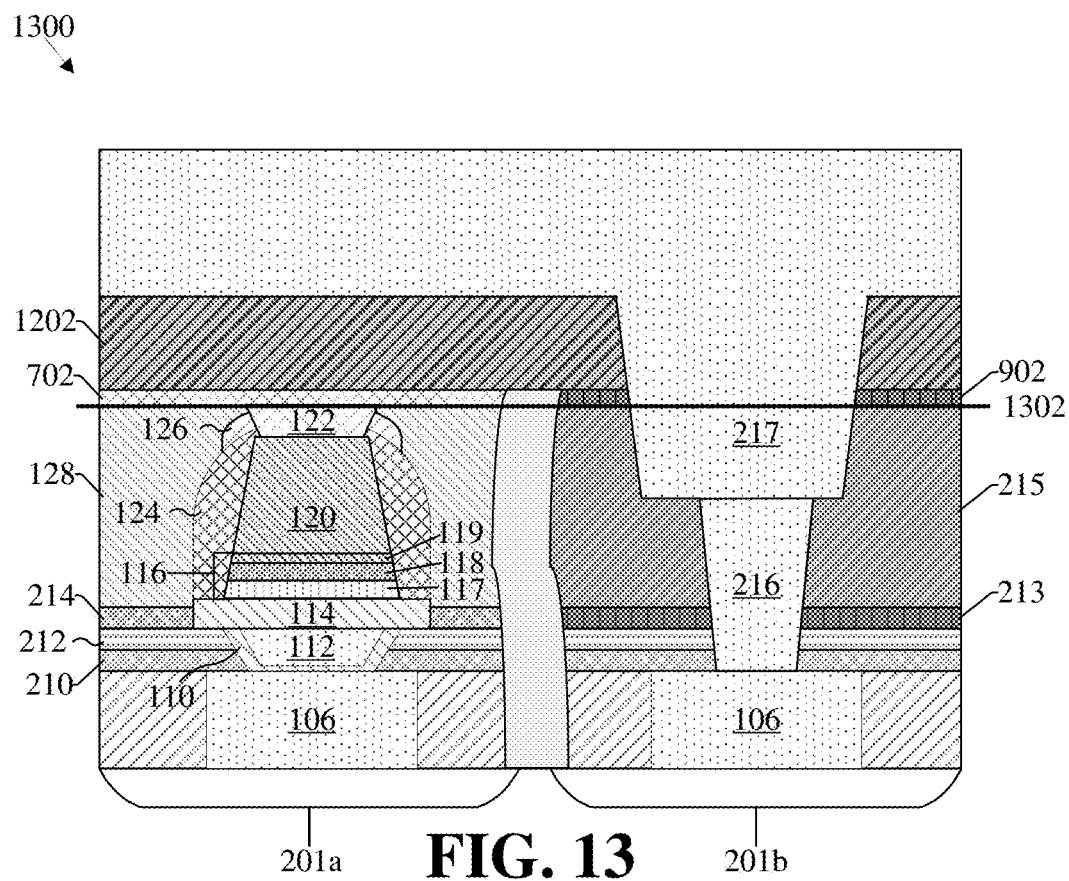

As shown in cross-sectional view 1300 of FIG. 13, the opening 1206 is filled with a conductive material. Filling the opening 1206 with a conductive material forms a third conductive via 216 over the interconnect wire 106 within the logic region 201*b*. In some embodiments, the third conductive via 216 may be comprised of copper, for example. Filling the opening 1206 with the conductive material also forms a second conductive wire 217 over the third conductive via 216. In some embodiments, the second conductive wire 217 may be comprised of copper, for example. The second conductive wire 217 is surrounded by the fourth ILD layer 215 and extends past sidewalls of the third conductive via 216. A CMP process is preformed along line 1302 to remove the conductive material from outside of the opening 1206 and define the second conductive wire 217. The line 1302 is located between the second ILD layer 128 and the fourth etch stop layer 702 in the embedded memory region 201*a* and between the fourth ILD layer 215 and the top dielectric layer 902 in the logic region 201*b*. The line 1302 is a level horizontal line. The CMP process may also remove the fourth etch stop layer 702, the top dielectric layer 902, and the fourth masking layer 1202. The CMP process exposes a top surface of the top electrode via 122, the second ILD layer 128, the second conductive wire 217, and the fourth ILD layer 215. A level horizontal line extends along a top surface of the top electrode via 122 and a top surface of the second conductive wire 217. The second conductive wire 217 is surrounded by the fourth ILD layer 215 and extends past sidewalls of the third conductive via 216.

Figure 14:
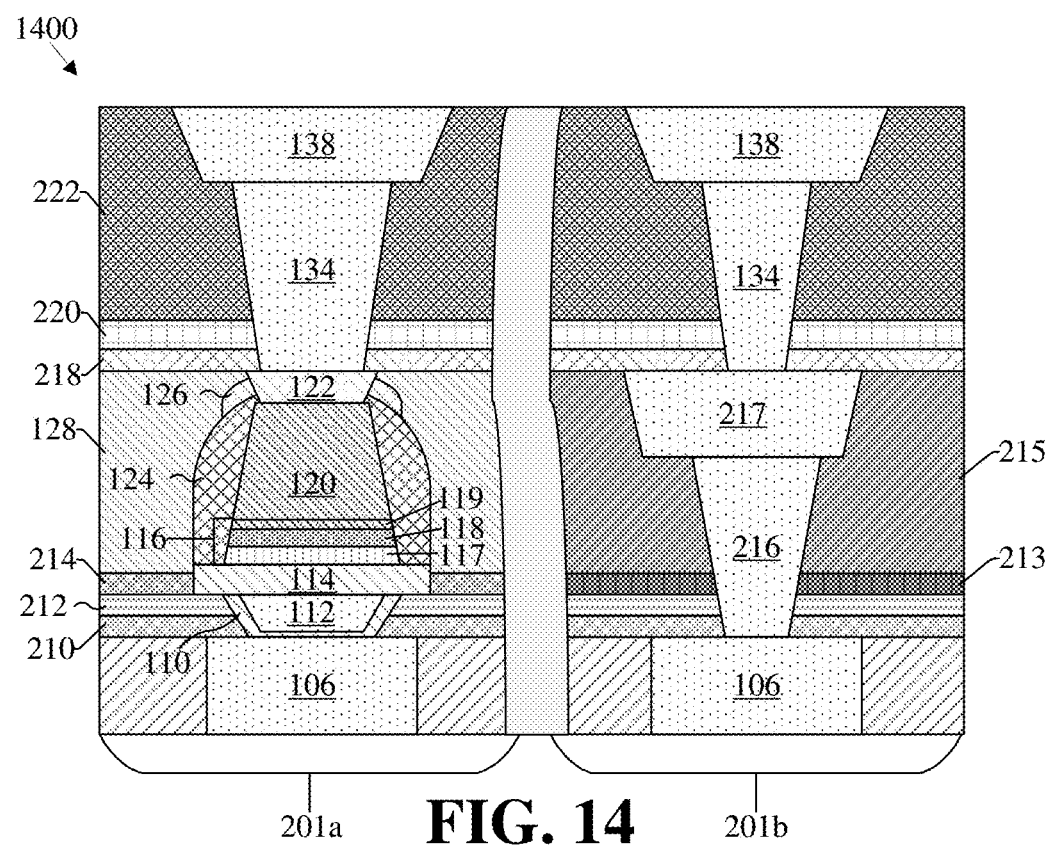

As shown in cross-sectional view 1400 of FIG. 14, a third etch stop layer 218 is formed over the embedded memory region 201*a* and logic region 201*b*. In some embodiments, the third etch stop layer 218 may comprise a silicon carbide layer having a thickness within a range of approximately 50 Angstroms and approximately 500 Angstroms. A third dielectric layer 220 is formed over the third etch stop layer 218. In some embodiments, the third dielectric layer 220 may comprise a TEOS layer having a thickness within a range of approximately 50 Angstroms and approximately 500 Angstroms. A fifth ILD layer 222 is formed over the third dielectric layer 220. In some embodiments, the fifth ILD layer 222 may comprise a different material than the second ILD layer 128 that surrounds the MRAM cell 111. For example, in some embodiments, the fifth ILD layer 222 may comprise a dielectric material having a third dielectric constant (e.g., a low-k dielectric layer) and the second ILD layer 128 may comprise dielectric material having a fourth dielectric constant (e.g., a low-k dielectric layer) that is lower than the third dielectric constant. A fifth masking layer (not shown) is formed over the fifth ILD layer 222. The fifth masking layer exhibits sidewalls defining an opening disposed above the second conductive wire 217 within the logic region 201*b*, and an opening disposed above the top electrode via 122 within the embedded memory region 201*a*. An etching process is carried out to expose an upper surface of the second conductive wire 217 within the logic region 201*b* and the top surface of the top electrode via 122 within the embedded memory region 201*a*.

A second conductive via 134 is formed over the second conductive wire 217 within the logic region 201*b*, and over the top electrode via 122 within the embedded memory region 201*a*. In some embodiments, the second conductive via 134 may be comprised of copper, for example. The second conductive via 134 directly contacts the substantially flat top surface of the top electrode via 122. A bottom surface of the second conductive via 134 has a width within a range of approximately 30 nanometers to approximately 90 nanometers. Because the upper surface of the top electrode via 122 is substantially flat, the top electrode via 122 abuts the second conductive via 134 along an interface between two conductive materials, thereby providing for a low resistance between the top electrode via 122 and the overlying second conductive via 134. A first conductive wire 138 is formed over the second conductive via 134. In some embodiments, the first conductive wire 138 may be comprised of copper, for example. The first conductive wire 138 is surrounded by the fifth ILD layer 222 and extends past sidewalls of the second conductive via 134. In some embodiments, a CMP process is then performed on the second conductive via 134 and fifth ILD layer 222 to planarize an upper surface of the second conductive via 134 and fifth ILD layer 222.

Figure 15:
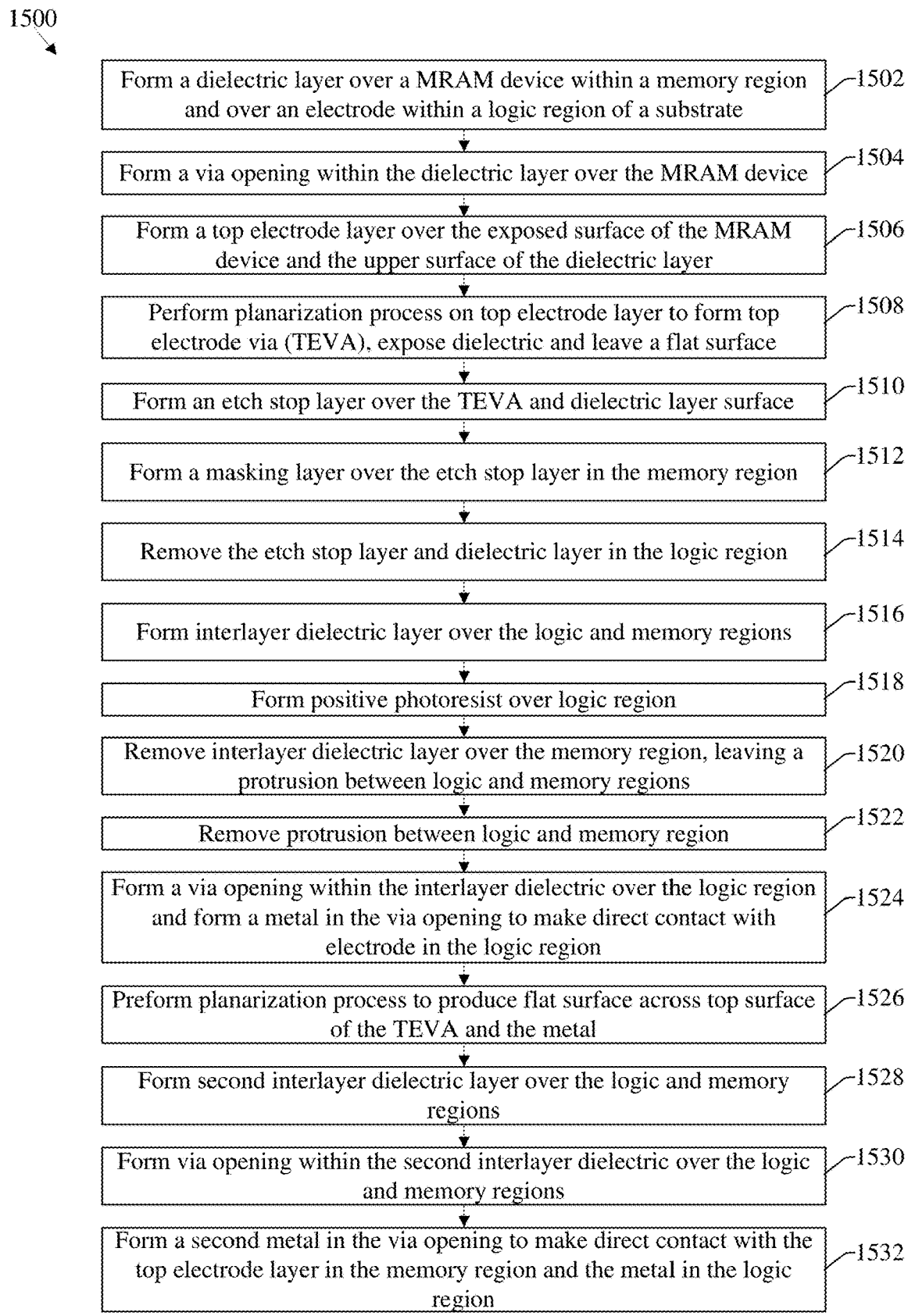
FIG. 15 illustrates a methodology in flowchart format that illustrates some embodiments of a method of forming a memory device including an embedded memory region comprising a MRAM cell having a MTJ and a logic region, according to the present disclosure.

FIG. 15 illustrates a method 1500 of forming a memory device in accordance with some embodiments. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1502, a dielectric layer is formed over an MRAM device within a memory region and over an electrode within a logic region. FIG. 3 illustrates a cross-sectional view 300 corresponding to some embodiments of act 1502.

At 1504, a via opening is formed within the dielectric layer over the MRAM device. FIG. 4 illustrates a cross-sectional view 400 corresponding to some embodiments of act 1504.

At 1506, a top electrode layer is formed over the exposed surface of the MRAM device and the upper surface of the dielectric layer. FIG. 5 illustrates a cross-sectional view 500 corresponding to some embodiments of act 1506.

At 1508, a planarization process is performed on the top electrode layer to form a top electrode via (TEVA), expose dielectric, and leave a flat surface. FIG. 6 illustrates a cross-sectional view 600 corresponding to some embodiments of act 1508.

At 1510 etch stop layer over is formed over the TEVA and a dielectric layer surface. FIG. 7 illustrates a cross-sectional view 700 corresponding to some embodiments of act 1510.

At 1512, a masking layer is formed over the etch stop layer in the memory region. FIG. 7 illustrates a cross-sectional view 700 corresponding to some embodiments of act 1512.

At 1514, the etch stop layer and dielectric layer are removed in the logic region. In some embodiments, FIG. 8 illustrates a cross-sectional view 800 corresponding to act 1514.

At 1516, an interlayer dielectric layer formed over the logic and memory regions. FIG. 9 illustrates a cross-sectional view 900 corresponding to some embodiments of act 1516.

At 1518, a positive photoresist formed over the logic region. FIG. 9 illustrates a cross-sectional view 900 corresponding to some embodiments of act 1518.

At 1520, the interlayer dielectric layer over the memory region is removed, leaving a protrusion between the logic and memory regions. FIG. 10 illustrates a cross-sectional view 1000 corresponding to some embodiments of act 1520.

At 1522, the protrusion between the logic and memory region is removed. FIG. 11 illustrates a cross-sectional view 1100 corresponding to some embodiments of act 1522.

At 1524, a via opening is formed within the interlayer dielectric over the logic region and a metal is formed in the opening to make direct contact with the electrode in the logic region. FIGS. 12-13 illustrate cross-sectional views 1200-1300 corresponding to some embodiments of act 1524.

At 1526, a planarization process is performed to produce a flat surface across top surface of the TEVA and the metal. FIG. 13 illustrates a cross-sectional view 1300 corresponding to some embodiments of act 1526.

At 1528, a second interlayer dielectric layer is formed over the logic and memory regions. FIG. 14 illustrates a cross-sectional view 1400 corresponding to some embodiments of act 1528.

At 1530, a via opening is formed within the second interlayer dielectric over the logic and memory regions through. FIG. 14 illustrates a cross-sectional view 1400 corresponding to some embodiments of act 1530.

At 1532, a second metal is formed in the via opening to make direct contact with the TEVA in the memory region and the metal in the logic region. FIG. 14 illustrates a cross-sectional view 1400 corresponding to some embodiments of act 1532.

Accordingly, in some embodiments, the present disclosure relates to a method of forming a MRAM cell that performs a chemical-mechanical planarization process to define a top electrode via having a flat top surface.

In some embodiments, the present disclosure relates to a method for manufacturing a memory device. The method includes forming a first masking layer disposed over a dielectric layer, wherein the first masking layer exhibits sidewalls defining an opening disposed above a magnetoresistive random-access memory (MRAM) cell located in an embedded memory region; forming a first via opening within the dielectric layer above the MRAM cell; forming a top electrode via layer over the MRAM cell and the dielectric layer; and performing a first planarization process on the top electrode via layer to remove part of the top electrode via layer and define a top electrode via having a substantially flat top surface. In another embodiment, before the first planarization process a top surface of the top electrode via layer defines a V-shape above the MRAM cell. In another embodiment, a bottom most point of the V-shape of the top electrode via layer is above a top surface of the dielectric layer. In another embodiment, performing the first planarization process causes the top surface of the top electrode via and the top surface of the dielectric layer to extend along a horizontal plane. In another embodiment, the MRAM cell includes a bottom electrode; a magnetic tunnel junction (MTJ), wherein a bottom surface of the MTJ is in direct contact with a top surface of the bottom electrode; and a top electrode, wherein a bottom surface of the top electrode is in direct contact with a top surface of the MTJ, wherein a top surface of the top electrode is in direct contact with a bottom surface of the top electrode via. In another embodiment, a bottom surface of the MTJ is wider than the top surface of the top electrode via. In an embodiment, the method further includes forming an interlayer dielectric over the top electrode via and the dielectric layer; forming a conductive via over the top electrode via within the interlayer dielectric; and forming a conductive wire above the conductive via within the interlayer dielectric, wherein the conductive wire extends past sidewalls of the conductive via. In an embodiment, the method further includes forming the dielectric layer over an interconnect wire within a logic region;

removing the dielectric layer in the logic region; forming an interlayer dielectric over the logic and memory array regions; removing the interlayer dielectric over the memory array region, wherein a protrusion comprising a remnant of the interlayer dielectric remains between the logic and memory array regions; and performing a second planarization process to remove the protrusion. In an embodiment, the method further comprises forming a first conductive via over the interconnect wire within the interlayer dielectric in the logic region; forming a first conductive wire within the interlayer dielectric above the first conductive via, wherein the first conductive wire extends past sidewalls of the first conductive via; performing a third planarization process on the interlayer dielectric and the first conductive wire; forming a second interlayer dielectric over the logic and memory array regions; forming a second conductive via within the second interlayer dielectric over the first conductive wire while forming a third conductive via within the second interlayer dielectric over the top electrode via; forming a second conductive wire within the second interlayer dielectric over the second conductive via, while forming a third conductive wire within the second interlayer dielectric over the third conductive via; and wherein the second conductive wire extends past sidewalls of the second conductive via, wherein the third conductive wire extends past sidewalls of the third conductive via. In another embodiment, after performing the third planarization process, a top surface of the interlayer dielectric, a top surface of the first conductive wire, the top surface of the top electrode via and a top surface of the dielectric layer are aligned and meet at a substantially level horizontal line.

In other embodiments, the present disclosure relates to a method for manufacturing a memory device. The method includes forming a first interlayer dielectric (ILD) layer above a magnetoresistive random-access memory (MRAM) cell located in an embedded memory region and above an upper dielectric layer located in a logic region, wherein the embedded memory region is adjacent to the logic region; selectively etching the first ILD layer to form sidewalls defining an aperture in the first ILD layer over the MRAM cell, the aperture exposing an upper surface of the MRAM cell; forming a top electrode via layer within the aperture and over the first ILD layer, wherein a top surface of the top electrode via layer defines a recess above the MRAM cell; performing a first planarization process on the top electrode via layer to remove part of the top electrode via layer defining the recess; replacing the first ILD layer within the logic region with a second ILD layer that is different than the first ILD layer; and forming an interconnect wire and via within the second ILD layer at locations laterally offset from the MRAM cell. In an embodiment, a bottom most point of the recess is above the top surface of the first ILD layer. In an embodiment, the top surface of the top electrode via and a top surface of the first ILD layer are level. In an embodiment, the method further includes forming a hardmask layer over the first ILD layer within the logic region and the embedded memory region; and selectively etching the first ILD layer according to the hardmask layer, wherein the hardmask layer is comprised of positive photoresist. In an embodiment, the method further includes forming a third ILD layer over the top electrode via and the first ILD layer; forming a conductive via over the top electrode via within the third ILD layer; and forming a conductive wire above the conductive via within the third ILD layer, wherein the conductive wire extends past sidewalls of the conductive via. In an embodiment forming the interconnect wire and the via within the second ILD layer includes forming the first ILD layer over a first conductive wire within a logic region; forming the second ILD layer over the logic and embedded memory regions; forming a second masking layer over the second ILD layer within the logic region; removing the second ILD layer over the embedded memory region, wherein a protrusion comprising a remnant of the interlayer dielectric remains between the logic and embedded memory regions; and performing a second planarization process to remove the protrusion. In an embodiment, the method further including forming a second conductive via over the first conductive wire while forming a third conductive via over the top electrode via layer, wherein a width of a bottom surface of the third conductive via is less than a width of the top surface of the top electrode via layer; and forming a second conductive wire over the second conductive via while forming a third conductive wire over the third conductive via.

In yet other embodiments, the present disclosure relates to an integrated circuit. The integrated circuit includes a magnetoresistive random-access memory (MRAM) cell disposed on a semiconductor substrate; a dielectric layer disposed over the MRAM cell; a top electrode via within the dielectric layer disposed over the MRAM cell, wherein a top surface of the top electrode via is flat; an interlayer dielectric layer disposed over the MRAM cell and the dielectric layer; a conductive via within the interlayer dielectric layer disposed over the top electrode via; and a conductive wire disposed over the conductive via, wherein the conductive wire extends past sidewalls of the conductive via. In an embodiment, the top surface of the top electrode via and a top surface of the dielectric layer are level. In an embodiment, a width of a top surface of the top electrode via is larger than a width of a bottom surface of the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
 a magnetic tunnel junction (MTJ) on a substrate;
 a top electrode on the MTJ, wherein a first segment of a top surface of the top electrode contacting a top point of a first sidewall of the top electrode is different from a second segment of the top surface of the top electrode contacting a top point of a second sidewall of the top electrode, wherein the top surface of the top electrode comprises a middle segment directly between the first segment and the second segment, wherein a first height of the first segment contacting the top point of the first sidewall is greater than a second height of the second segment contacting the top point of the second sidewall, wherein a third height of the middle segment is less than the first height and greater than the second height;
 a sidewall spacer comprising a first spacer on the first sidewall of the top electrode and a second spacer on the second sidewall of the top electrode, wherein each of the first spacer and the second spacer is a single continuous layer vertically extending from a bottom surface of the top electrode to the top surface of the top electrode, wherein a first surface of the first spacer comprises a first curve and a second surface of the second spacer comprises a second curve, wherein the first spacer is on a first sidewall of the MTJ and the second spacer is on a second sidewall of the MTJ, and wherein the first spacer is directly connected to the first segment and the second spacer is directly connected to the second segment; and a dielectric layer around the MTJ and top electrode.

2. The semiconductor structure of claim 1, wherein the middle segment is curved in a direction away from the bottom surface of the top electrode.

3. The semiconductor structure of claim 1, wherein the second curve is lower than the top surface of the top electrode.

4. The semiconductor structure of claim 1, further comprising:

an upper conductive structure directly contacting the top electrode, the first spacer, and the second spacer, wherein the upper conductive structure directly contacts the first segment and the second segment of the top surface of the top electrode.

5. The semiconductor structure of claim 4, wherein the upper conductive structure comprises a first outer sidewall directly adjacent to the first sidewall of the top electrode and having a bottom point vertically above the middle segment.

6. The semiconductor structure of claim 4, wherein a segment of a bottom surface of the upper conductive structure adjacent to the second sidewall of the top electrode is slanted.

7. The semiconductor structure of claim 1, wherein a top surface of the second spacer is lower than a top surface of the first spacer.

8. The semiconductor structure of claim 1, wherein the dielectric layer directly contacts the first and second spacers, and wherein the dielectric layer has a first material different from a second material of the first and second spacers.

9. An integrated chip, comprising:

a first dielectric layer overlying a substrate;

a memory cell disposed within the first dielectric layer, wherein the memory cell comprises a top electrode overlying a data storage structure;

an upper conductive structure overlying and directly contacting a top surface of the top electrode, wherein the upper conductive structure comprises a first outer sidewall and a second outer sidewall, wherein a first segment of a bottom surface of the upper conductive structure contacting a bottom point of the first outer sidewall and adjacent to a first sidewall of the top electrode is above a second segment of the bottom surface of the upper conductive structure contacting a bottom point of the second outer sidewall and adjacent to a second sidewall of the top electrode, wherein the bottom surface of the upper conductive structure comprises a curved segment between the first segment and the second segment, wherein the curved segment intersects a vertical line arranged at a midpoint of the bottom surface of the upper conductive structure;

a first spacer contacting the first sidewall of the top electrode, wherein an upper surface of the first spacer is curved, wherein the first spacer is a single continuous layer vertically extending from a bottom surface of the top electrode to the top surface of the top electrode, and wherein the first spacer is directly connected to the first segment of the bottom surface of the upper conductive structure; and a second spacer contacting the second sidewall of the top electrode, wherein an upper surface of the second spacer is curved.

10. The integrated chip of claim 9, wherein the second segment of the bottom surface of the upper conductive structure is slanted relative to a top surface of the substrate.

11. The integrated chip of claim 9, wherein the first outer sidewall physically contacts the first sidewall of the top electrode.

12. The integrated chip of claim 9, wherein the upper conductive structure contacts the upper surface of the first spacer and the upper surface of the second spacer directly.

13. The integrated chip of claim 9, wherein the curved segment is vertically below the bottom point of the first outer sidewall, and wherein the curved segment has curvature across an entire length of the curved segment.

14. The integrated chip of claim 9, further comprising:

an etch stop layer disposed on the first dielectric layer, wherein the bottom surface of the upper conductive structure is vertically below the etch stop layer.

15. The integrated chip of claim 9, wherein the second spacer continuously vertically extends from the bottom surface of the top electrode to the second segment of the bottom surface of the upper conductive structure, wherein a height of the second spacer is less than a height of the first spacer and is greater than a height of the top electrode.

16. An integrated chip, comprising:

a magnetic tunnel junction (MTJ) overlying a substrate;

a top electrode contacting the MTJ, wherein a first segment of a top surface of the top electrode adjacent to a first sidewall of the top electrode is different from a second segment of the top surface of the top electrode adjacent to a second sidewall of the top electrode, wherein the top surface of the top electrode comprises a curved segment between the first segment and the second segment;

a sidewall spacer layer overlying the substrate and contacting the MTJ, wherein the sidewall spacer layer is a single continuous layer and comprises:

a first spacer segment on the first sidewall of the top electrode; and a second spacer segment on the second sidewall of the top electrode, wherein the first spacer segment and the second spacer segment continuously vertically extend from a bottom surface of the top electrode to the top surface of the top electrode;

a first dielectric layer around the MTJ and the top electrode; and a conductive structure directly contacting the top electrode, the first spacer segment, and the second spacer segment, wherein the conductive structure directly contacts the first segment, the second segment, and the curved segment of the top surface of the top electrode, wherein a top surface of the conductive structure overlaps a sidewall of the first spacer segment and a sidewall of the second spacer segment, wherein a bottom point of an outermost sidewall of the conductive structure physically contacts a top point of the second sidewall of the top electrode.

17. The integrated chip of claim 16, wherein a height of the first spacer segment is greater than a height of the second spacer segment.

18. The integrated chip of claim 16, wherein a middle of the curved segment is laterally offset from the first sidewall and the second sidewall by a lateral distance that is greater than a length of a bottom surface of the first spacer segment.

19. The integrated chip of claim 16, wherein the curved segment is vertically below the bottom point of the outermost sidewall of the conductive structure.

20. The integrated chip of claim 16, wherein a width of the top surface of the conductive structure is greater than a width of the top surface of the top electrode.

* * * * *